July 3, 1962 C. M. CAMPBELL, JR 3,042,815
HIGH-SPEED, NON-SATURATING TRANSISTOR STEERING FLIP-FLOP
Filed June 27, 1960
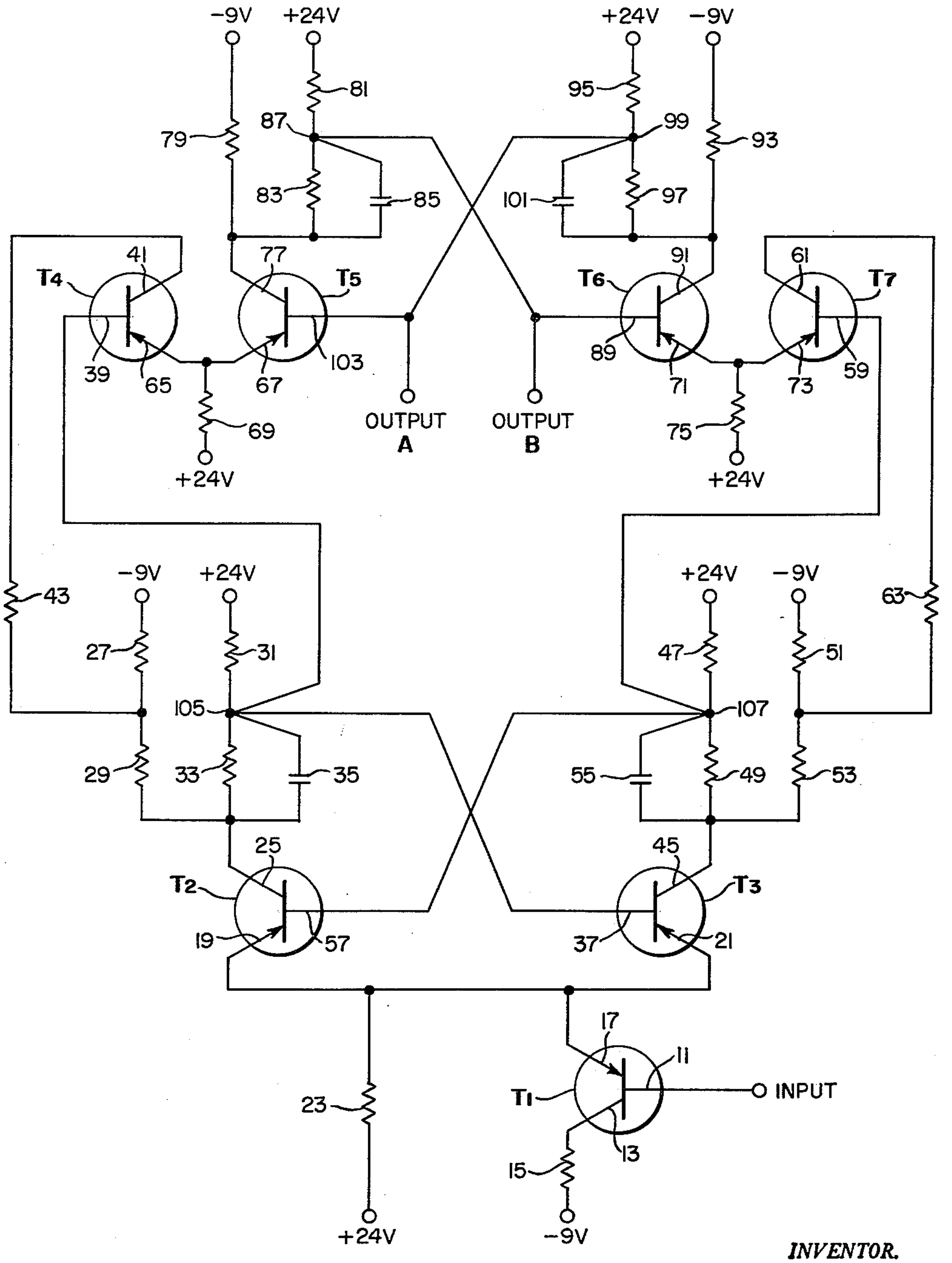
INVENTOR.
CARL M. CAMPBELL, JR.
BY Frank H. Cullen
ATTORNEY

3,042,815
HIGH-SPEED, NON-SATURATING TRANSISTOR STEERING FLIP-FLOP

Carl M. Campbell, Jr., Broomall, Pa., assignor to Burroughs Corporation, Detroit, Mich., a corporation of Michigan Filed June 27, 1960, Ser. No. 38,939
7 Claims. (Cl. 307—88.5)

This invention relates to bistable circuits and more specifically to a bistable circuit utilizing transistors. The device is a non-saturating unconditional steering flip-flop.

A flip-flop is an electronic device having two stable states and requiring a trigger pulse or signal to provide an abrupt change from the first stable state to the second stable state. Various output signals may be derived from the circuit. The utilization of transistors in the invention achieves reliability, compactness, low power dissipation, high efficiency, low power requirements and good mechanical rigidity.

A bistable circuit finds use in a number of situations, particularly in the computer art, where various signals are required. In the circuit of the present invention, the simplicity with which various outputs and frequencies can be obtained makes it very flexible. The bistable circuit of the present invention operates in two distinct states or modes: a first state or mode wherein certain of the transistors are conducting and produce an output, and a second mode where other of the transistors are conducting and produce a second output. It is to be understood that an output may means a pulse or signal which rises (or falls) from some quiescent voltage level. The outputs may be of the same or different characteristics. Continuous input signals produce continuous output signals and at a frequency dependent upon the input signal frequency.

The present invention is a non-saturating circuit which allows improved switching time from one stable state to another. The result of non-saturation is to diminish hole storage and thus allow fast recovery and rapid switching. Also, less power is required to switch a non-saturated transistor than a saturated device. Non-saturation operation also enables the use of drift transistors which are particularly adaptable to this type of operation.

Unconditional steering of the flip-flop, i.e., the output signal is not conditioned upon the characteristics of the input pulse or signal, is achieved by permitting the triggering pulses, which are applied to switch the circuit from one state to its other state, to be insensitive to pulse amplitude and pulse width above certain minimums. Switching of the flip-flop is also independent of the trigger pulse rise and fall times. These features insure reliable switching of the device.

Many prior art bistable circuits operated in the saturated region which prevented fast switching times. Further, many prior art devices were sensitive to the characteristics of the triggering pulse or signal. The present invention overcomes the disadvantages of prior art circuits and utilizes a circuit wherein all the transistors are of the same type. Preferably, PNP having a control electrode and two main current carrying electrodes, transistors are utilized and high speeds may be more easily reached when this type of transistor is used.

An object of the present invention is to improve the operation of a transistor flip-flop.

It is another object of the invention to increase the switching speed and reliabilty of a flip-flop.

It is a further object of the invention to render the flip-flop insensitive to pulse switching amplitude and width above certain minimum values.

It is a still further object of the invention to eliminate reactive delay in a flip-flop by the use of additional elements.

These and other objects are accomplished, in a preferred embodiment, by utilizing a circuit comprising two flip flops, a "driver" and a "master." The "driver" flip-flop comprises a pair of recipro-conducting transistors having their emitters coupled to an "input" transistor and the "master" flip-flop comprises four transistors, two of which are "on" or "off" simultaneously. The circuit combines the two flip-flops to form an unconditional steering flip-flop without the use of additional gates or transistors.

The "master" flip-flop is ordinarily a non-complementing type, e.g., it has two input terminals and will change its state only in response to a pulse of a given polarity applied to one of its two input terminals; if such a pulse is applied to its other terminal, the flip-flop will remain in the same state and will not switch to its other stable state. The "master" flip-flop comprises a pair of "output" transistors, each "output" transistor having an "auxiliary" transistor coupled thereto and to the "driver" flip-flop. The input to the "driver" flip-flop is through the emitter electrodes. The input pulse to the "driver" flip-flop indirectly turns both of the "driver" flip-flop transistors "off" during the pulse interval as hereinfater described.

The circuit is such that two transistors of the "master" flip-flop are conducting at any one time: an "output" transistor and the "auxiliary" transistor of the nonconducting "output" transistor. The conducting "auxiliary" transistor of the "master" flip-flop supplies an unbalancing current to the "driver" flip-flop. This current raises the voltage at the base of the "on" or conducting "driver" transistor, tending to turn that transistor "off." However, resistors of selected relative values have been placed in the circuit of the unbalancing current and of the driver transistors, so that the base of the "off" driver transistor is held positive with respect to the base of the "on" driver transistor, thereby overcoming the effect of the unbalancing current from the conducting "auxiliary" transistor. In the type of circuit shown, nothing further happens until there is a pulse input since the transistor with the more negative base will remain "on" and the other transistor will remain "off."

A negative input signal turns the "input" transistor "on" and this insures that both the "driver" transistors are nonconducting, which is necessary during the transition from one stable state to the other. The unbalancing current is now unopposed and makes the base of the previously conducting "driver" transistor more positive than the base of the previously nonconducting transistor. Therefore, when the input pulse disappears and current resumes flowing in the "driver" transistors, the effect of the unbalancing current is to cause the previously nonconducting "driver" to conduct. This in turn makes the "master" flip-flop change state. The formerly nonconducting "auxiliary" transistor now conducts and will supply the unbalancing current that assures a change of state after the next input pulse. Capacitors are utilized to improve the rise and fall desired of the output signal and are not essential to the flip-flop operation.

While the foregoing is a summary, the invention will be best understood from a detailed description of a preferred embodiment taken together with the drawing wherein the figure is a schematic representation of the present invention.

$T_1$ is the "input" transistor; $T_2$ and $T_3$ comprise the "driver" flip-flop; and, $T_4$, $T_5$, $T_6$ and $T_7$ comprise the "master" flip-flop. Further, the transistors $T_4$ and $T_7$ are the "auxiliary" transistors while the transistors $T_5$ and $T_6$ are the "output" transistors.

The input transistor has a base 11 and a collector 13 coupled to a resistor 15 and a source of negative potential. The resistor 15 is used only to reduce power to the transistor. The emitters 17, 19 and 21 of $T_1$, $T_2$ and $T_3$, respectively, are coupled to a source of positive potential through the resistor 23. The collector 25 of $T_2$ is coupled to the common point of a double pair of parallel resistors 27, 29, 31 and 33 forming first and second voltage dividers. In parallel with the resistor 33 is the capacitor 35. Coupled to the common point of the resistors 31 and 33 and the capacitor 35 are the bases 37 and 39 of $T_3$ and $T_4$, respectively. This common point is shown in the figure as junction 105. The common point of the resistors 27 and 29 is coupled to the collector 41 of $T_4$ through the resistor 43.

The collector 45 of $T_3$ is connected to the common point of a double pair of parallel resistors 47, 49, 51 and 53 forming first and second voltage dividers like those coupled to collector 25 of $T_2$. Junction 107 is the common junction of the base 57 of $T_2$, the base 59 of $T_7$, the resistors 47 and 49 and the capacitor 55, which is in parallel with resistor 49. The collector 61 of $T_7$ is coupled to the common point of the resistors 51 and 53 through the resistor 63. The emiters 65 and 67 of $T_4$ and $T_5$, respectively, are coupled to a source of positive potential through the resistor 69. Similarly, the emitters 71 and 73 of $T_6$ and $T_7$ are coupled to a source of positive potential through the resistor 75. A source of negative potential is coupled to the collector 77 of $T_5$ through the resistor 79. In parallel with the resistor 79 and coupled to the collector 77 of $T_5$ are the resistors 81 and 83, which are joined at the point 87. In parallel with the resistor 83 is a capacitor 85. The point 87 is coupled to the base 89 of $T_6$. A source of positive potential is applied to one terminal of the resistor 81. Output B is taken from the conductor joining the point 87 and the base 89 of $T_6$.

The collector 91 of $T_6$ is coupled to a source of negative potential through the resistor 93. In parallel with the resistor 93 and also coupled to the collector 91 are the resistors 95 and 97 having a common point 99 to form voltage divider. In parallel with the resistor 97 is the capacitor 101. The base 103 of $T_5$ is coupled to the point 99. Coupled to the resistor 95 is a source of positive potential. Output A is taken from the conductor joining the point 99 and the base 103 of $T_5$.

The capacitors 35, 55, 85 and 101 are not necessary for operation of the circuit. Similarly, the resistors 43 and 63 can be eliminated as they are used only to limit current flow.

The operation of the circuit will now be described. We will assume that the device is in operation and that $T_2$, $T_5$ and $T_7$ are conducting and $T_1$, $T_3$, $T_4$ and $T_6$ are nonconducting. The transistors utilized in the invention are of the PNP type. With this configuration, emitters, when conducting, are biased positively with respect to the base and collectors are biased negatively with respect to the base. It will be understood that transistors of the opposite conductivity can be used by reversing the battery polarities. The current path of $T_7$, which as noted is conducting, is such that an unbalancing current passes through the resistor 63 and the resistor 51 to the negative potential. The resistor 63 is only used to reduce power dissipation in $T_7$ and is not essential to circuit operation.

$T_2$, as noted, is conducting and its collector current path through the resistors 29 and 27 will cause the voltage at the junction 105 to be higher than the voltage at junction 107. Therefore, due to the connections, the biasing on $T_3$ and $T_4$ is such that these transistors are nonconducting. When $T_4$ is nonconducting, $T_5$ is conducting since the proper biasing appears at its electrodes. Similarly, $T_6$ is held nonconducting since the conduction of $T_5$ makes base 89 more positive than base 59 and it is possible for only one transistor of the group $T_6$—$T_7$ (or the group $T_4$—$T_5$) to conduct at any one time.

When an input signal is applied to the base 11 of $T_1$, $T_1$ is rendered conductive and both $T_2$ and $T_3$ are rendered nonconducting. Since $T_2$ is now nonconducting, the voltage at junction 107 will exceed the voltage at junction 105 since $T_2$ is no longer drawing current. During this time $T_7$ is still conducting and supplying the unbalancing current through the resistor 51. The junction 107 does not, however, become more positive than the base 89 of $T_6$ so there is at this point no change in the master flip-flop.

When the input signal applied to $T_1$ disappears, current is again available to either $T_2$ or $T_3$ depending upon their respective base voltage levels. The junction 107 is higher than the junction 105 due to the current from $T_7$. Because of the direct connection of the base 57 of $T_2$ and the junction 107, $T_2$ is prevented from conducting and $T_3$ will commence conduction. The junction 107 will then become positive enough to drive $T_7$ into a nonconducting state. As $T_7$ is extinguished, the voltage on the emitter 71 of $T_6$ rises which places the proper bias on its electrodes for conduction. An output is now derived at Output A.

$T_5$ becomes nonconducting due to the coupling of its base 103 through the resistor 97 to the collector 91 of $T_6$. With $T_5$ nonconducting, the voltage on the emitter 65 of $T_4$ immediately rises and produces conduction to that transistor.

The circuit has completely reversed states by rendering $T_2$, $T_5$ and $T_7$ nonconducting and rendering $T_3$, $T_4$ and $T_6$ conducting. During the transition of the master flip-flop from one stable state to another, an output was derived at Output A. $T_4$ now supplies the unbalancing current through the resistors 43 and 27. With $T_3$ now conducting, its collector current path includes both the resistors 51 and 53.

Very briefly, the action of the circuit in switching from its first state to its other state was as follows:

The input signal turned $T_1$ on, which turned $T_2$ off. With both $T_2$ and $T_3$ off, the voltage at the terminal 107 exceeded the voltage at the terminal 105. Nothing further happened until the input signal turned $T_1$ off. With $T_1$ off, $T_3$ now conducts followed by the extinguishing of conduction through $T_7$ and the immediate turn on of $T_6$. An output signal was derived. Likewise, $T_5$ is extinguished and $T_4$ commences conduction.

The circuit is presently in its second stable state and in order to return to the first stable state, transistors $T_2$, $T_5$ and $T_7$ must be rendered conductive and transistors $T_3$, $T_4$ and $T_6$ must be rendered nonconductive. $T_1$, of course, conducts only during the signal input period. The switching action of the flip-flop is entirely independent of the duration and amplitude (above a certain minimum) of the input signal pulse due to the coupling as previously explained.

To return the flip-flop to its first stable state, an input signal is applied to the base 11 of $T_1$ which causes conduction in that transistor and the extinguishing of $T_3$ due to the emitter 17–emitter 21 connection. $T_2$ is nonconductive while in the second state and at this point remains nonconductive. As soon as the input signal to the base 11 of $T_1$ disappears, $T_2$ will conduct since the voltage at the junction 105 is more positive than the voltage at the junction 107 due to the unbalancing current from the conducting transistor $T_4$ through the resistor 27. $T_3$ is prevented from conducting and as noted, $T_2$ turns on. The junction 105 will then be positive enough to turn $T_4$ off. This immediately causes $T_5$ to conduct and produce an output at Output B. $T_7$ now supplies the unbalancing current which is through the resistors 63 and 51. The circuit has reversed its state and has produced an output. The switching action from the second state to the first state was likewise independent of the duration or amplitude of the input signal above certain minimums. Also, the operation of the circuit is completely independent of the input signal rise and fall time which insures reliable and rapid action.

Thus there has been disclosed, a non-saturating unconditional steering flip-flop which is reliable in operation, extremely rapid in switching, the switching being independent of signal amplitude, signal width, and signal rise and fall times. Continuous signals applied to the input terminal produce continuous output signals.

In an embodiment of the flip-flop which was constructed and operated, the values of the components were as follows:

Resistors 15, 33 and 49—560 ohms
Resistors 23, 31, 47, 69, 75, 81, and 95—3,000 ohms
Resistors 29 and 53—160 ohms
Resistors 27 and 51—200 ohms
Resistors 43 and 63—360 ohms
Resistors 79 and 93—300 ohms
Resistors 83 and 97—510 ohms
Capacitors 35 and 55—.002 microfarad
Capacitors 85 and 101—.002 microfarad
$T_1$ was a type—CK751
$T_2$ and $T_3$—CK751
$T_4$, $T_5$, $T_6$ and $T_7$—CK751

The unbalancing current supplied by the auxiliary transistor of the master flip-flop was approximately 8 milliamperes.

While the foregoing is a recitation of the values of the components utilized in the working model that was constructed and operated, it is understood that various alterations or changes can be made without departing from the scope of the invention.

I claim:

1. A bistable transistor circuit comprising a first driver transistor and a second driver transistor, a first auxiliary transistor and a second auxiliary transistor, a first output transistor and a second output transistor, each of said transistors having a base, an emitter, and a collector, input means coupled to the emitters of said first and said second driver transistors, means coupling the base of said first driver transistor to said collector of said second driver transistor, means coupling the base of said second driver transistor to said collector of said first driver transistor, a first source of potential coupled to said collector of said first driver transistor, a second source of potential coupled to said collector of said second driver transistor, a third source of potential coupled to said emitters of said first auxiliary transistor and said first output transistor, a fourth source of potential coupled to said emitters of said second output transistor and said second auxiliary transistor, coupling means between said base of said first output transistor and said collector of said second output transistor, coupling means between said base of said second output transistor and said collector of said first output transistor, output terminals coupled to each of said bases of said first and said second output transistors, a fifth source of potential coupled to said collector of said first output transistor, a sixth source of potential coupled to said collector of said second output transistor, means coupling said base and said collector of said first auxiliary transistor to said collector of said first driver transistor, and means coupling said base and said collector of said second auxiliary transistor to said collector of said second driver transistor.

2. The combination as defined in claim 1 wherein said input means comprises a transistor and a source of potential.

3. The combination as defined in claim 1 wherein said coupling means between each of said first auxiliary transistor and said first driver transistor and said second auxiliary transistor and said second driver transistor comprises resistor-capacitor networks.

4. A bistable transistor device comprising an input flip-flop having a pair of driver transistors each having a control electrode and two main current carrying electrodes, the control electrode and a main current carrying electrode being cross-coupled, input means common to the other main current carrying electrodes of said driver transistors, an auxiliary transistor associated with each said driver transistor and having a control electrode and two main current carrying electrodes, the control electrode and one main current electrode of each said auxiliary transistor being coupled to the corresponding main current carrying electrode of its associated driver transistor, a master flip-flop having a pair of output transistors, each with a control electrode and two main current carrying electrodes, the control electrodes and a corresponding main current carrying electrode of each being cross-coupled, a direct connection between the other main current carrying electrode of one of said output transistors and the corresponding current carrying electrode of one of said auxiliary transistors, a direct connection between the other main current carrying electrode of one of said output transistors and the corresponding current carrying electrode of one of said auxiliary transistors, a second direct connection between the other main current carrying electrode of the other of said output transistors and the corresponding current carrying electrode of the other of said auxiliary transistors, and potential means coupled across said output transistors said auxiliary transistors supplying current through common impedances to said direct connections, whereby either of said auxiliary transistors, when conducting, supplies an unbalancing current to its associated driver transistor, tending to inhibit conduction through the other driver transistor cross-coupled thereto.

5. The combination as set forth in claim 4 wherein the control electrode and the main current carrying electrode coupled to the associated driver transistor are connected through voltage divider networks.

6. A complementing, non-saturating transistor circuit having two stable states, comprising an input flip-flop having a pair of driver transistors, each with base, emitter, and collector, a pair of first and second voltage dividers connected respectively to the collectors of said pair of transistors, operating potential means connected respectively to said first and second voltage dividers, the bases and collectors of said driver transistors being cross-coupled through said first voltage dividers, a first direct connection between said emitters of said driver transistors, means in series with said first direct connection to limit the current through either of said driver transistors when conducting to a value less than saturation, an auxiliary transistor associated with each said driver transistor and having a base, emitter and collector, the base of each said auxiliary transistor being coupled to the collector of its associated driver transistor at the same point, respectively, in each of said pair of first voltage dividers as the said cross-coupling of the base of the other driver transistor, the collector of each auxiliary transistor being coupled to the collector of its associated driver transistor through the respective one of said pair of second voltage dividers, a master flip-flop having a pair of output transistors, each with base, emitter and collector, a pair of third voltage dividers with potential means coupled thereacross connected respectively to the collectors of said pair of output transistors, the bases and collectors of said output transistors being cross-coupled through said third voltage dividers, a second direct connection between the emitter of one of said output transistors and the emitter of one of said auxiliary transistors, a third direct connection between the emitter of the other of said output transistors and the emitter of the other of said auxiliary transistors, and means in series with said second and third direct connections to limit the current through said one output transistor and the other of said auxiliary transistors in one of said states and to limit the current through the other of said output transistors and said one auxiliary transistor in the other of said states to a value less than saturation.

7. A bistable circuit comprising a master flip-flop having a pair of cross-coupled output transistors each with at least one main current carrying electrode and each with an auxiliary three-electrode transistor coupled to the main current carrying electrode thereof and across a source of potential, and a driver flip-flop having a pair of cross-coupled input transistors, each of said input transistors being directly connected to an electrode of one of said auxiliary transistors and resistively coupled to two electrodes of the other of said auxiliary transistors, whereby a current induced in one or the other of said auxiliary transistors tends to unbalance said driver flip-flop.

References Cited in the file of this patent

UNITED STATES PATENTS

| | | |
|---|---|---|
| 2,885,574 | Roesch | May 5, 1959 |
| 2,939,969 | Kwap et al. | June 7, 1960 |

UNITED STATES PATENT OFFICE

CERTIFICATE OF CORRECTION

Patent No. 3,042,815 July 3, 1962

Carl M. Campbell, Jr.

It is hereby certified that error appears in the above numbered patent requiring correction and that the said Letters Patent should read as corrected below.

Column 1, line 31, for "means" read -- mean --; lines 59 and 60, strike out "having a control electrode and two main current carrying electrodes," and insert the same after "transistors", in lines 60 and 61, same column 1; column 3, line 37, before "voltage" insert -- a --; column 6, lines 9 to 12, strike out "a direct connection between the other main current carrying electrode of one of said output transistors and the corresponding current carrying electrode of one of said auxiliary transistors,".

Signed and sealed this 4th day of December 1962.

(SEAL)

Attest:

ERNEST W. SWIDER
Attesting Officer

DAVID L. LADD
Commissioner of Patents